(12) United States Patent
Koduri

(10) Patent No.: US 7,531,893 B2
(45) Date of Patent: May 12, 2009

(54) POWER SEMICONDUCTOR DEVICES HAVING INTEGRATED INDUCTOR

(75) Inventor: Sreenivasan K. Koduri, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 228 days.

(21) Appl. No.: 11/458,417

(22) Filed: Jul. 19, 2006

(65) Prior Publication Data

US 2008/0029907 A1    Feb. 7, 2008

(51) Int. Cl.
*H01L 23/495* (2006.01)

(52) U.S. Cl. .................. 257/676; 257/696; 257/692; 257/784; 257/E23.031; 257/E23.052

(58) Field of Classification Search ......... 257/666–686, 257/692, 696, 784, E23.031, E23.052
See application file for complete search history.

(56) References Cited

U.S. PATENT DOCUMENTS

2004/0032011 A1 *   2/2004   Warner et al. ............... 257/676

* cited by examiner

*Primary Examiner*—M. Wilczewski
*Assistant Examiner*—Telly D Green
(74) *Attorney, Agent, or Firm*—Yingsheng Tung; Wade J. Brady, III; Frederick J. Telecky, Jr.

(57) ABSTRACT

An electronic device (100) with one or more semiconductor chips (102) has an inductor (101) assembled on or under the chips. The inductor includes a ferromagnetic body (111) and a wire (104) wrapped around the body to form at least a portion of a loop; the wire ends (104a) are connected to the chips. The assembly is attached to a substrate (103), which may be a leadframe. The device may be encapsulated in molding compound (140) so that the inductor can double as a heat spreader (111c), enhancing the thermal device characteristics.

18 Claims, 5 Drawing Sheets

POWER SEMICONDUCTOR DEVICES HAVING INTEGRATED INDUCTOR

FIELD OF THE INVENTION

The present invention is related in general to the field of semiconductor devices and processes, and more specifically to structure and method of integrated inductors for power semiconductor devices.

DESCRIPTION OF THE RELATED ART

Time to Market is a significant factor for the success of semiconductor components in the rapidly expanding markets served by electronic products. All too often, though, a redesign of the semiconductor component is required in order to satisfy the changing characteristic requested by a customer or by the technical needs of a new trend in products.

Another significant success factor for semiconductor products is the capability to satisfy the market trend for miniaturization. This trend is driven and accelerated by new applications for semiconductor products such as hand-held appliances, which prefer small-size components. However, an unwelcome roadblock to miniaturization appears, whenever a component has to be added as a discrete external part to the product, rather than to be integrated into already existing devices.

The addition of an external part is particularly bothersome in power driver circuits, DC-to-DC converters, and power controller circuits. A large inductor (up to 200 nH) is usually needed along with the controller/converter circuit. Traditionally, this large inductor is placed as a separate component on the printed circuit board, requiring large amounts of interconnection and current to be routed through the package substrate; the interconnection creates excessive resistance loss and thermal heating.

SUMMARY OF THE INVENTION

Applicant recognizes the need for a fresh approach to integrate the inductor with the circuit and to offer at the same time the opportunity to fine-tune the inductance characteristics, improve the thermal device performance, and shield the magnetic field from interfering with the circuit. The methodology should be coherent, low-cost, and flexible enough to be applied to different semiconductor product families, including single chip and multi-chip products, and a wide spectrum of design and process variations including wire bond, flip-chip, and metal stud assemblies. With the capability of adjusting circuits internally, the product miniaturization can be supported and time to market can be reduced.

The embodiments of the invention place a magnetic core, such as iron, on or under the components and create one or more loops, or partial loops, with a wire around the core to generate the needed inductance with the least amount of routing and resistance drop. The inductor wire may be looped by a bonder and is bonded directly to the component. After encapsulation, the package size of the integrated device is significantly reduced compared to conventional side-by-side assembly.

One embodiment of the invention is an electronic device, which has a semiconductor chip (or component) with a first and a second set of terminals and a substrate with contact pads; the pads are connected to the second set terminals. The device further has a body containing ferromagnetic material with a flat area smaller than the component area. The flat body area is attached to one surface of the chip; the other chip surface is attached to the substrate. A wire is wrapped around the body periphery to form at least a portion of a loop; the wire ends are connected to the first set terminals.

In some embodiments, the chip may include more than one semiconductor chip (integrated circuit, discrete component). The substrate may be a metallic leadframe. The material used for attaching the ferromagnetic body and the chip may be thermally conductive to enhance the thermal device performance. The electrical chip connections may be bonding wires or metal studs. The wire loops around the ferromagnetic body may be created by a bonder as used in semiconductor manufacturing, or may be prefabricated using off-line equipment.

Another embodiment of the invention is an electronic device, which has a semiconductor chip or component with a first and a second set of terminals, a substrate with contact pads, and a body containing ferromagnetic material including a first and a second flat portion. A wire is wrapped around the body to form at least a portion of a loop; the wire ends are connected to the first set terminals. The chip is attached to the first flat portion of the body, and the second flat portion of the body is attached to the substrate. The first set terminals are connected to the ports and the second set terminals are connected to the contact pads.

Another embodiment of the invention is a method for fabricating an electronic device. The method places a ferromagnetic body, such as an iron body, on a chip; next, at least a portion of a loop, preferably one or more wire loops, around the body is created. The preferred technique employs a wire bonder, which is also used to form the electrical interconnections of semiconductor devices. For some embodiments, an off-line built inductor may be preferred, especially in devices with a flat area of the body formed by a plate, which extends beyond the body periphery. The plate may be made of ferromagnetic material so that the plate is operable to diminish the magnetic field interfering with the chip circuitry.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 1 shows a schematic cross section of an encapsulated power device with a semiconductor component assembled on a substrate and an inductor with ferromagnetic core attached to the active component surface.

FIG. 2 displays a schematic cross section of the device of FIG. 1 with hooks separating the wire loops around the inductor core.

FIG. 3 illustrates a schematic cross section of an inductor with pads for attachment to a semiconductor component.

FIG. 4 depicts a schematic cross section of the inductor of FIG. 3 after assembly on the active surface of the semiconductor component.

FIG. 5 shows a schematic cross section of the device of FIG. 4 after encapsulation; the inductor retains an un-encapsulated surface to double as thermal heat spreader.

FIG. 6 is a schematic cross section of a semiconductor component with metal studs for flip-assembly.

FIG. 7 illustrates a schematic cross section of an inductor with pads designed for attachment to a semiconductor component, which has metal studs.

FIG. 8 displays a schematic cross section of a packaged electronic device including a semiconductor component with metal studs flip-assembled on a leadframe and topped by an attached inductor.

FIG. 9 is a schematic partial X-ray view of an encapsulated multi-chip device assembled on a leadframe, prepared for attachment of an inductor as shown in FIG. 8.

FIG. 10 shows a schematic cross section of a power device with a semiconductor component assembled on an inductor with ferromagnetic core, and the inductor, in turn, attached to a substrate such as a leadframe.

FIG. 11 illustrates a schematic cross section of the device of FIG. 10 after encapsulation; the inductor, attached to the substrate, can double as thermal heat spreader; a passive component may be attached to the active surface of the semiconductor chip.

FIG. 12 depicts a schematic cross section of an embodiment analogous to the device of FIG. 11 for an SON-type leadframe.

FIG. 13 shows a schematic cross section of an integrated inductor of a power device with simplified SON-type leadframe.

FIG. 14 displays the embodiment of FIG. 13 with exposed inductor for improved thermal heat spreading.

DETAILED DESCRIPTION OF THE PREFERRED EMBODIMENTS

Figure 1:
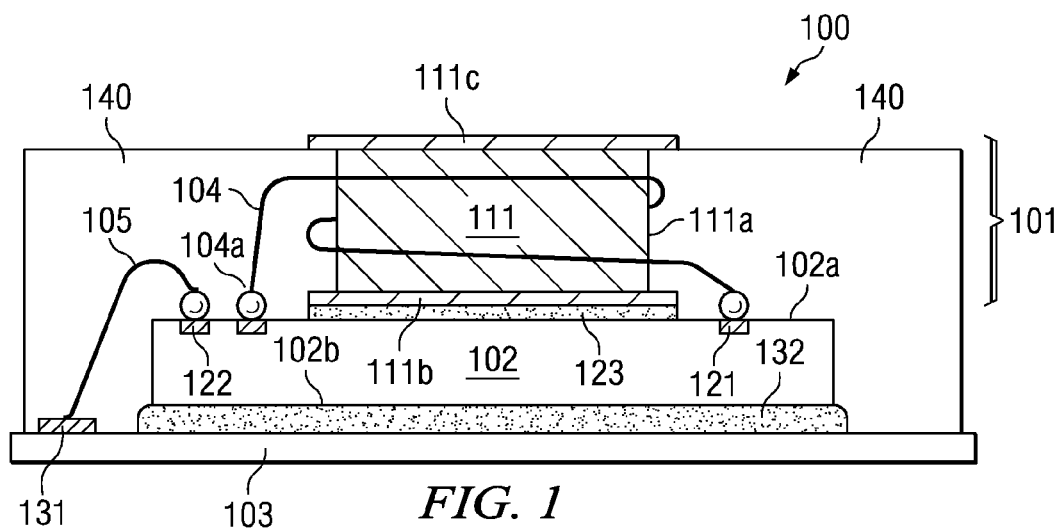
FIGS. 1 to 9 illustrate embodiments, in which an inductor is placed on top of the semiconductor component assembled on a substrate.

FIG. 1 illustrates an embodiment, generally designated 100, which integrates an inductor, capable of generating an inductance of several hundred nano-Henry (nH), with a semiconductor power component, such as a power driver circuit, a DC-to-DC converter, or a power controller circuit. The inductor 101 is positioned on top of the chip or component 102, which in turn is assembled on a substrate 103.

Component 102 may be an integrated circuit chip, a discrete component, or a multi-chip arrangement; it may include semiconductor devices made of silicon, silicon germanium, gallium arsenide, or any other semiconductor material. Component 102 has a certain area, and an active surface 102a and a passive surface 102b. On the active surface 102a are a first set of terminals 121 and a second set of terminals 122.

Inductor 101 has a body 111, which includes ferromagnetic material such as iron. The body has a periphery 111a and a flat surface 111b. The flat surface 111b has an area smaller than the area of component 102. The shape of body 111 may be cylindrical or rectangular, and body 111 may be solid or hollow.

In the embodiment of FIG. 1, the ferromagnetic body 111 has two flat areas, 111b and 111c. It is preferred that both flat areas are formed by a plate, which extends beyond the body periphery 111a. The plates are preferably made ferromagnetic material such as an iron sheet; the sheets operate to diminish the magnetic field interfering with the chip circuitry. In addition, the plates are thermally conductive. In some embodiments, plate 111c is enlarged and left outside of encapsulation 140. The plate can thus serve as a heat spreader, greatly improving the thermal performance of embodiment 100.

Substrate 103 may be the chip pad of a metallic leadframe, or it may be a sheet-like substrate made of insulating material laminated with one or more layers of patterned conductive lines and vias. Substrate 103 has contact pads 131.

In FIG. 1, the passive surface 102b of chip 102 is attached to substrate 103 by a layer 132 of adhesive material. Further, the flat surface 111b of body 101 is attached to the active surface 102a of component 102, preferably by a layer 123 of adhesive material, which is thermally conductive. The thermal conductivity of layer 123 can substantially improve the distribution of the heat generated by the active chip surface.

As FIG. 1 shows, a wire 104, preferably made of gold or copper, is wrapped around the periphery 111a of body 111; the wrapping may include a portion of a loop, a full loop, or several loops. The first and second ends 104a of wire 104 are connected to the first set terminals 121 of chip 102, preferably by ball bonds or stitch bonds. Further, the second set terminals 122 are preferably connected to substrate contact pads 131 by wire bonds 105. Alternatively, the second set terminals are connected to the substrate contact pads by metal studs in a flip-assembly method.

Figure 2:
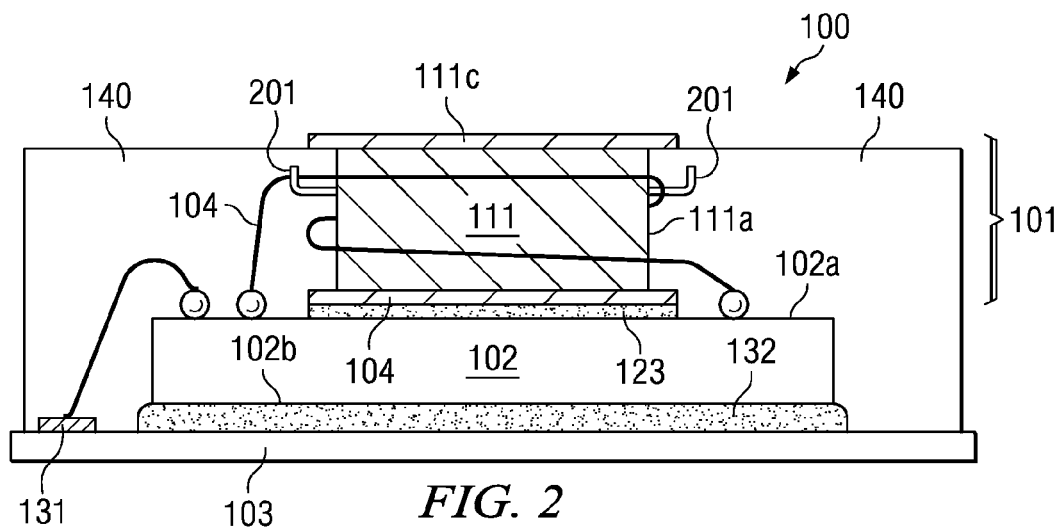

To prevent an electrical short between the wire loops or the wire and the body periphery 111a, wire 104 may have an insulating coat on its surface; alternatively, the body periphery may an insulting layer on the body surface or an insulating film between the body surface and the wire loops. As another option, FIG. 2 illustrates loop separators 201 to keep the wire loops from getting shorted. Separators 201 are strategically positioned hooks or notches, which hold individual loops and keep a distance between the looping wires and the surface of the body. The wire 104 can be guided through these structures by manipulating the wire bonded in a precise manner manually or by a computer.

In the preferred fabrication method, wire 104 is wrapped around the periphery of body 111 by a bonder similar to the wire bonder used to manufacture the wire bonds 105. In addition, the wire ends 104a are attached to the first set terminals 121 by ball or stitch bonds.

Referring to FIG. 1 and FIG. 2, the assembled component 102, the ferromagnetic body 111 and the electrical connections 104 and 105 are preferably encapsulated in an insulating compound 140 such as an epoxy-based molding compound.

Based on the ferromagnetic material in body 111, inductor 101 can easily provide a self inductance of several hundred nH, even for only few wire loops. Generally, the self induction coefficient L, or simply the induction L, of an elongated coil, which has n tight windings or loops so that the magnetic field outside the coil can be neglected, is proportional to $n^2$. The proportionality factor includes the magnetic permeability $\mu$ (which has the dimension joule·$sec^2$/$coulomb^2$·meter) multiplied by the cross section F ($meter^2$) of the coil, divided by the length l (meter) of the coil.

$$L = (\rho F/l) n^2.$$

The unit of inductance is 1 Henry (H)=1 joule·$sec^2$/$coulomb^2$=1 volt·sec/ampere. The inductance in integrated circuits is typically expressed in $10^{-9}$ H=nH.

For vacuum, the magnetic permeability $\mu$ is equal 1; for air, $\mu$ is close to 1; for ferromagnetic materials, $\mu$ can have values of several hundred to several ten thousand dependent on the iron content and the construction of the ferromagnetic body.

Figure 3:
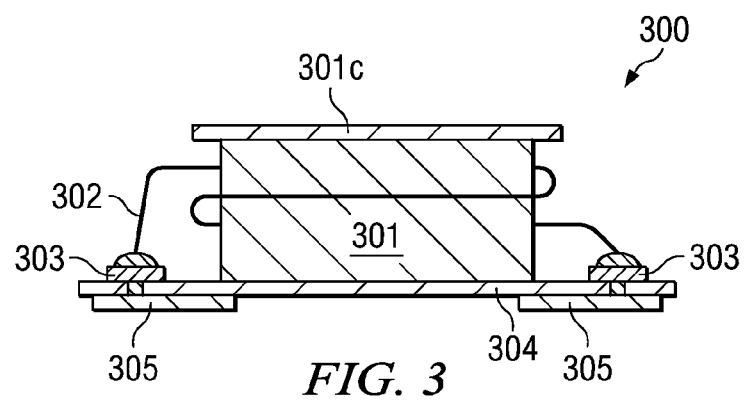
Figure 4:
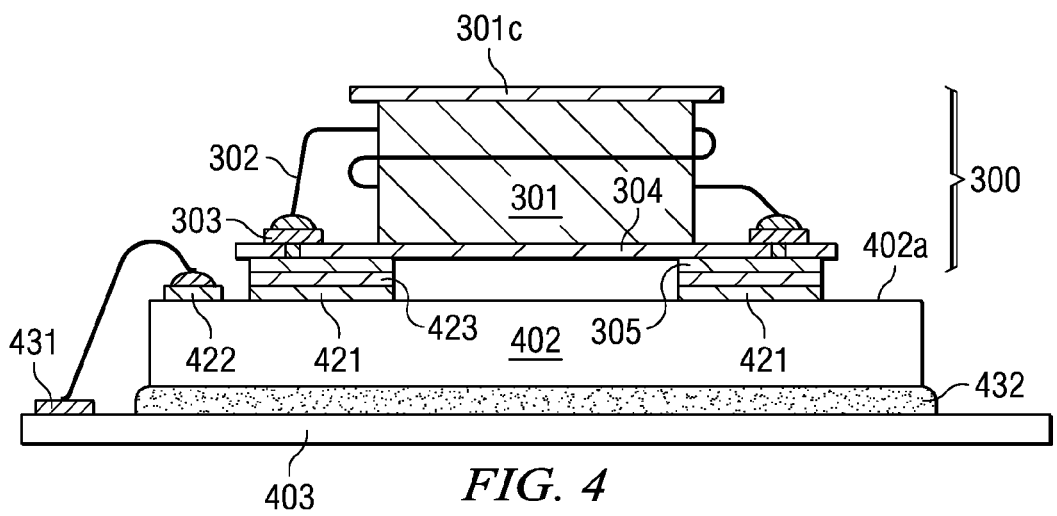
Figure 5:
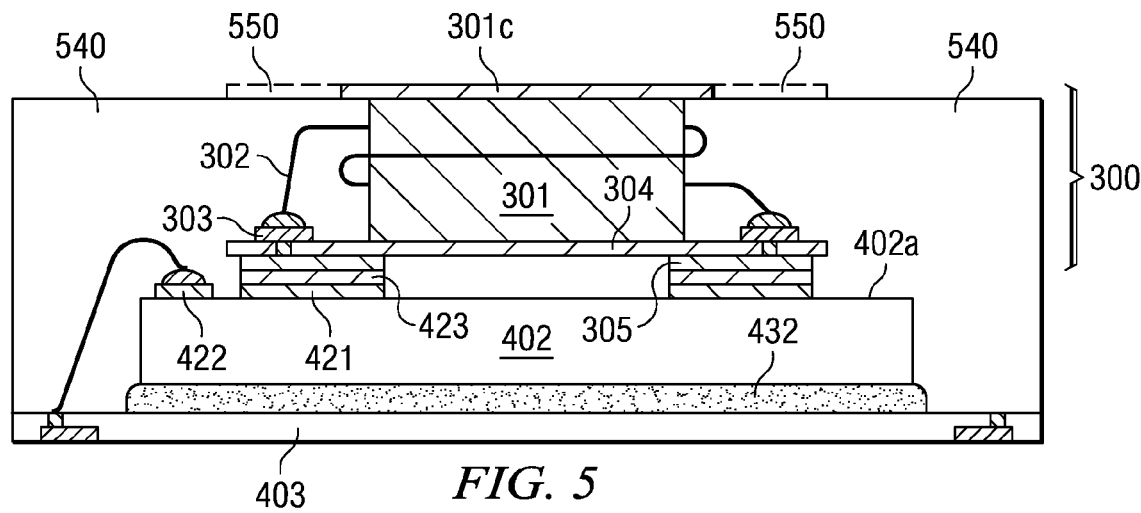

FIGS. 3 to 5 illustrate an embodiment assembled with an inductor manufactured separately from the fabrication of the chip wire bonding. FIG. 3 shows an inductor, generally designated 300, with a ferromagnetic core 301 and an inductor wire 302 forming at least one loop around the core, without contacting the core. The wire ends are connected to attachment sites 303 located on an extension of the end plate, which has external pads 305 for connection to the semiconductor component. Pads 305 have a metallurgical surface composition suitable either for solder attachment, or for conductive adhesive (such as silver-filled epoxy). While it is preferred for some embodiments to employ the inductor 300 as an off-line fabricated part, it is alternatively feasible to wrap wire 302 around core 301 by a wire bonder after the inductor has been assembled.

In FIG. 4, inductor 300 is assembled on component 402. The active surface 402a of component 402 has a first set of terminals 421, which are positioned and shaped to match the pads 305 of the inductor. Pads 305 are conductively attached to terminals 421 using an electrically conductive attach material 423 such as solder or metal-filled epoxy. The large size of pads 305 reduces the interconnect resistance of the assembly in FIG. 4. Active surface 402a further has a second set or terminals 422, which serve the connections (such as wire bonds) to substrate contact pads 431. Component 402 is attached to substrate 403 using attach material 432, which is preferably thermally conductive. Substrate 403 may be the component pad of a metallic leadframe, or a laminated substrate.

FIG. 5 indicates the encapsulation 540 of the assembly of FIG. 4 so that the top plate 301c on inductor core 301 remains exposed outside of the encapsulation material. In other embodiments, top plate 301c is extended to a size indicated by dashed extensions 550. The extended plate increases the thermal dissipation, especially with the aid of an attached external heat sink.

Figure 6:
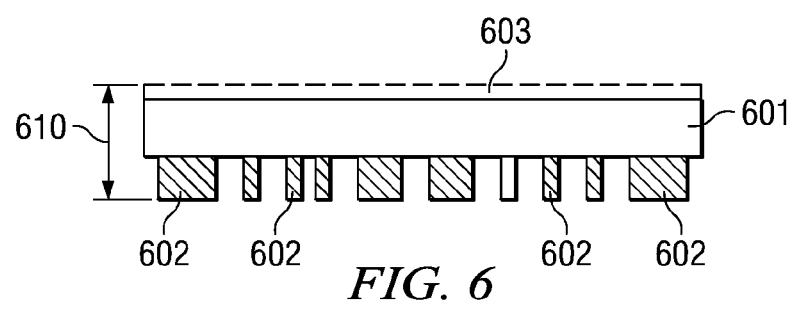

Another embodiment of an inductor designed for integration with flip-assembled components is illustrated in FIGS. 6 to 9. A simplified cross section of a chip or component 601 with metal studs is shown in FIG. 6. The component 601, for instance an integrated circuit chip, has a multitude of metal studs 602, such as copper bumps, deposited on the chip I/O ports as a replacement of connecting wires. A preferred deposition method is plating. For some embodiments, it is advantageous to pre-attach a thermally conductive buffer 603 on the passive surface of the chip. An example is silver-filled epoxy, which can also serve as an adhesive to attach the inductor on the chip. Due to the height 610 of the metal-studded component, the inductor has to have high conductive stand-off pins.

Figure 7:
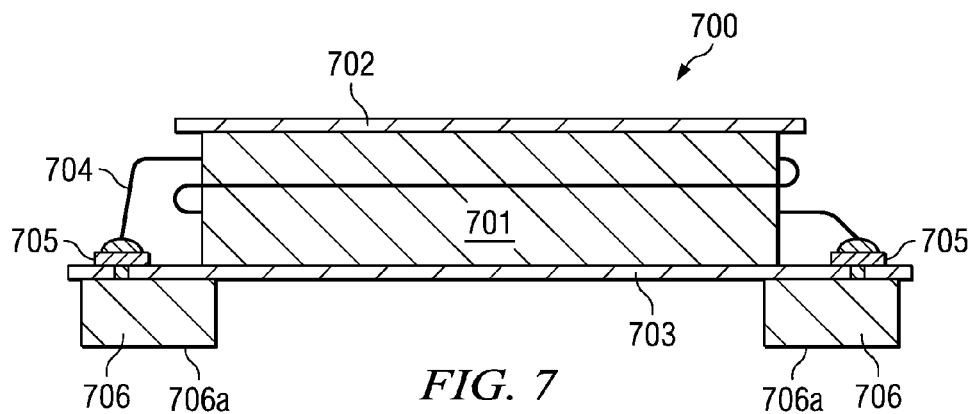

FIG. 7 depicts the inductor 700. A ferromagnetic core 701 has a plated metal top 702 and plated metal bottom 703. In the embodiment of FIG. 7, plate 702 has a smaller diameter than plate 703; in other embodiments, plate 702 may have the same as, or even larger diameter than plate 703. An inductor wire 704 forms at least one loop around the core, without contacting the core. The wire ends are connected to attachment sites 705 located on plate 703. The bottom plate also has conductive standoff pins 706 for connection to the semiconductor component. Pins 706 have a surface 706a with a metallurgical composition suitable either for solder attachment, or for conductive adhesive (such as silver-filled epoxy). While it is preferred to employ the inductor 700 as a separate part, it is alternatively feasible to wrap wire 704 around core 701 by a wire bonder as used in semiconductor wire bonding.

Figure 8:
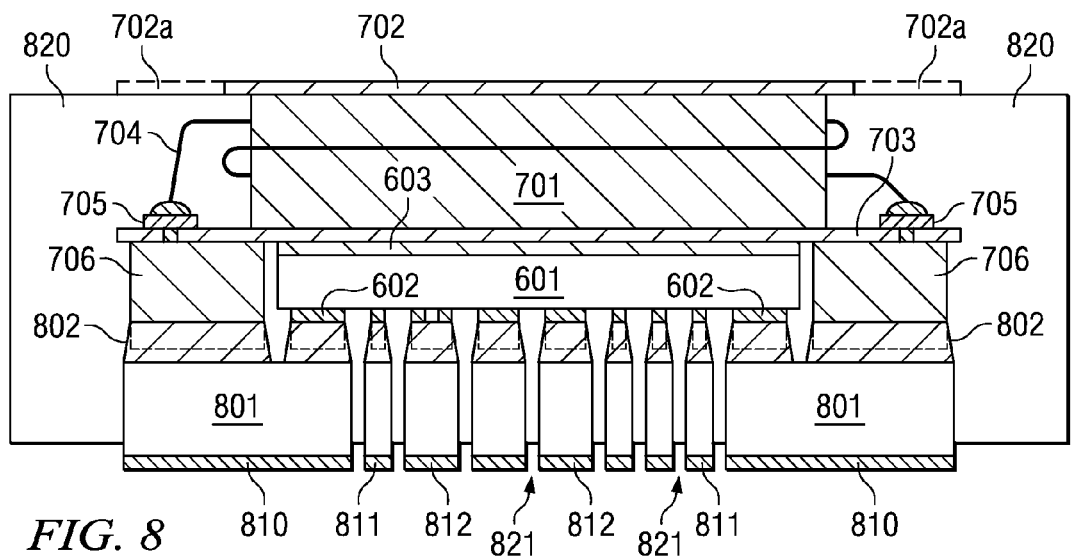

FIG. 8 illustrates the inductor integrated with the semiconductor component after assembly and encapsulation. The attachment of inductor plate 703 to component 601 is facilitated by thermal attachment layer 603. In order to accomplish the attachment onto substrate 801, a layer 802 of reflow metal (solder) or silver-filled epoxy is employed. It should be noted that substrate 801 is shaped to provide localized external pins 810, 811, 812, etc. A preferred embodiment for substrate 801 is a metallic leadframe configured as a so-called "small outline no-lead" (SON) frame. Inductor pins 706 and component metal studs 602 are partially immersed in layer 802. A single pass process step at elevated temperature is sufficient to accomplish the attachment between layer 802 and metal suds 602 and inductor pins 706; an example is solder attachment by metal reflow.

After the assembly of inductor, component and substrate (leadframe), the unit is encapsulated, preferably in an epoxy-based molding compound 820. As FIG. 8 shows, the encapsulation compound embeds the component and the inductor core and wire, and fills all device and assembly gaps (such as 821), but leaves the bottom contacts (external pins) 810 etc., and the top inductor plate 702 un-encapsulated. Plate 702 serves as heat spreader and thermal conductor to the ambient or a heat sink; this function is optimized by extending plate 702 as indicated in FIG. 8 by the dashed lines 702a. On the other hand, keeping the area of plate 702 smaller than the area of plate 703 facilitates the winding of wire by a wire bonder.

Figure 9:
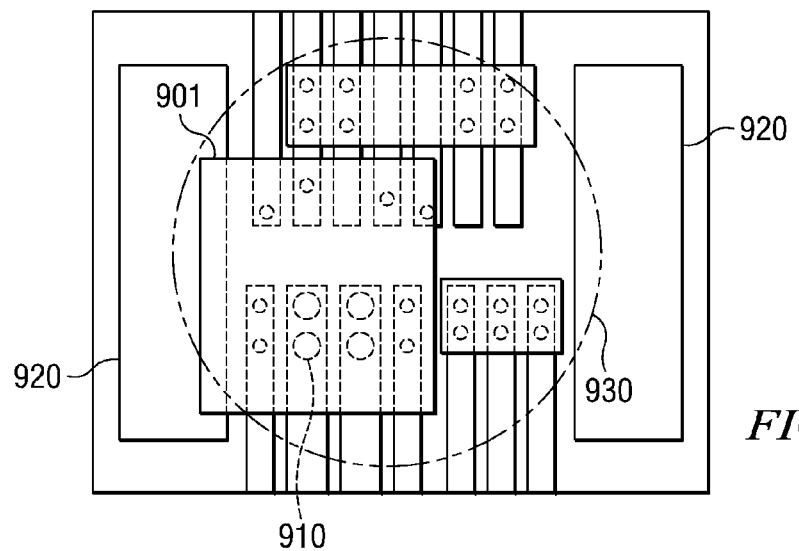

The technology of providing the connection of the component by metal studs instead of wires simplifies the assembly of multi-chip devices. As an example, FIG. 9 depicts (in a partial X-ray view) a device with three chips 901 flip-attached by studs onto a leadless metallic leadframe 920. The assembly replaces the single chip 601 in FIG. 8, while the attached inductor 930 serves the multi-chip assembly.

Figure 10:
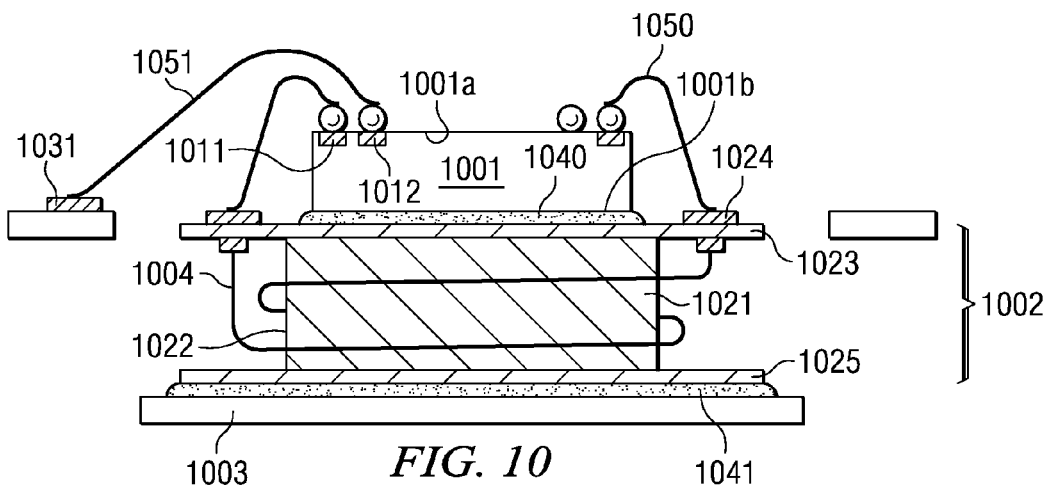
FIGS. 10 to 14 depict embodiments, in which an inductor is placed between the component and the substrate.

Another embodiment of the invention, illustrated in FIGS. 10 to 14, integrates the inductor into the semiconductor power device by positioning the component on top of the inductor. In FIG. 10, the component 1001 may be an integrated circuit chip, a discrete component, or a multi-chip arrangement. Component, or chip, 1001 has an active surface 1001a and a passive surface 1001b. On the active surface 1001a are a first set of terminals 1011 and a second set of terminals 1012.

Inductor 1002 is made of a body 1021, which includes ferromagnetic material such as iron. The body has a periphery 1022, a first flat portion 1023 with connection ports 1024, and a second flat portion 1025. The shape of body 1021 may be cylindrical or rectangular, and body 1021 may be solid or hollow. It is preferred that both flat portions 1023 and 1025 are formed by a plate, which extends beyond the body periphery 1022. The plates are preferably made ferromagnetic material such as an iron sheet; the sheets operate to diminish the magnetic field interfering with the chip circuitry. In addition, the plates are thermally conductive. The plates can thus serve as heat spreaders, greatly improving the thermal device performance.

Substrate 1003 may be the chip pad of a metallic leadframe, or it may be a laminated substrate. Substrate 1003 has contact pads 1031.

In FIG. 10, the passive surface 1001b of component 1001 is attached to first flat portion 1023 of inductor 1002 by a layer 1040 of adhesive material, which is preferably thermally conductive. Further, the second flat portion 1025 of the inductor is attached to substrate 1003, preferably by a layer 1041 of adhesive material, which is thermally conductive. The first set terminals 1011 are connected to the ports 1024 by bond wires 1050.

As FIG. 10 shows, a wire 1004, preferably made of gold or copper, is wrapped around the periphery 1022 of body 1021; the wrapping may include a portion of a loop, a full loop, or several loops. The first and second ends of wire 1004 are connected to the first set terminals 1011 of component 1001; in more detail, the wire ends are attached to first plate 1023 and from the plate ports 1024 through bond wires 1050 to terminals 1011.

Further, the second set terminals 1012 are connected to substrate contact pads 1031 by wire bonds 1051. In FIG. 10, where the substrate is embodied as a leadframe, the inductor is attached to the pad of the leadframe and the contact pads 1031 are embodied as the leads; in turn, the leads are connected by bonding wires 1051 to the second set terminals 1012.

To prevent an electrical short between the wire loops or the wire and the body periphery 1022, wire 1004 may have an insulating coat on its surface; alternatively, the body periphery 1022 may an insulting layer on the body surface or an insulating film between the body surface and the wire loops. As another option, the inductor may have hooks or notches positioned so that individual loops are kept at a distance from each other and from the periphery 1022 (see also FIG. 2).

Figure 11:
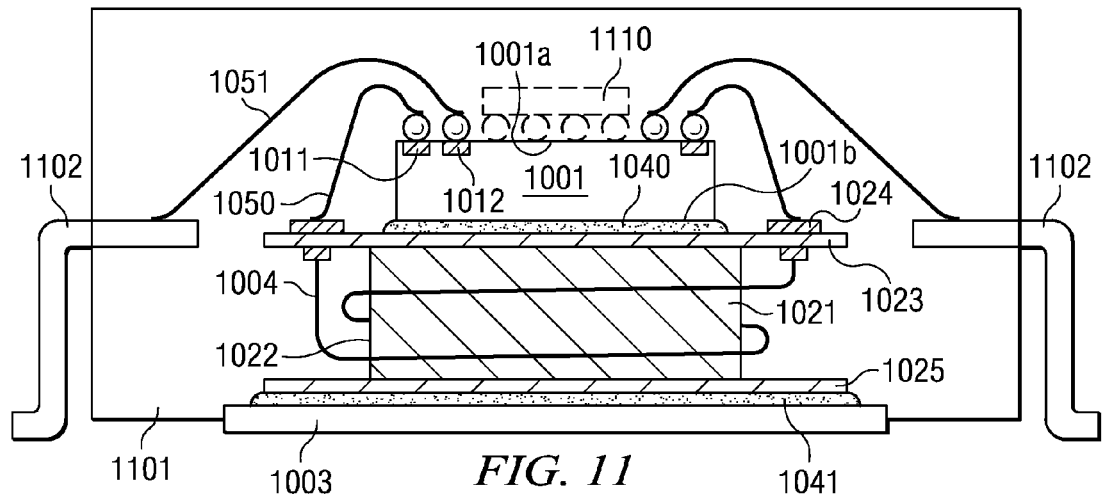

In FIG. 11, the assembled chip, the ferromagnetic body, and the electrical connections are encapsulated in an insulating compound 1101, preferably an epoxy-based molding compound. The encapsulation process leaves the device pad 1003 of the substrate (leadframe) un-encapsulated for unimpeded thermal conduction and heat spreading. On the other hand, leads 1102 of the leadframe are trimmed and formed for surface mount assembly to external parts. The assembly and packaging process steps are low cost, and the resulting device has a small size.

For some embodiments, it is advantageous to further integrate passive components, such as input/output capacitors, into the same package. FIG. 11 indicates this possibility by the flip-assembled component 1110, shown in dashed outline.

Figure 12:
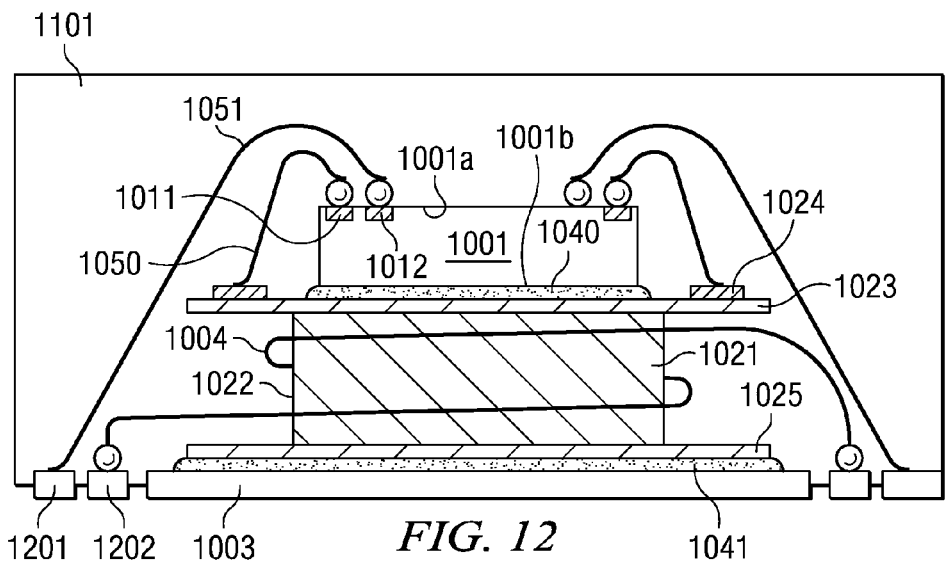

The substrate of the embodiment in FIG. 12 is shown as a leadframe configuration for an SON (Small Outline, No Lead) package. The inductor and component assembly is attached to pad 1003, and the wire connections 1051 of the second set component terminals are attached to pins 1201, while the wire ends of the inductor wire 1004 are attached to pins 1202. The connection from pins 1202 to the first set component terminals run through the external circuitry. In this embodiment, it is preferred to wind the inductor wire 1004 by a wire bonder, which has been instructed to also connect the wire ends to pins 1202.

Figure 13:
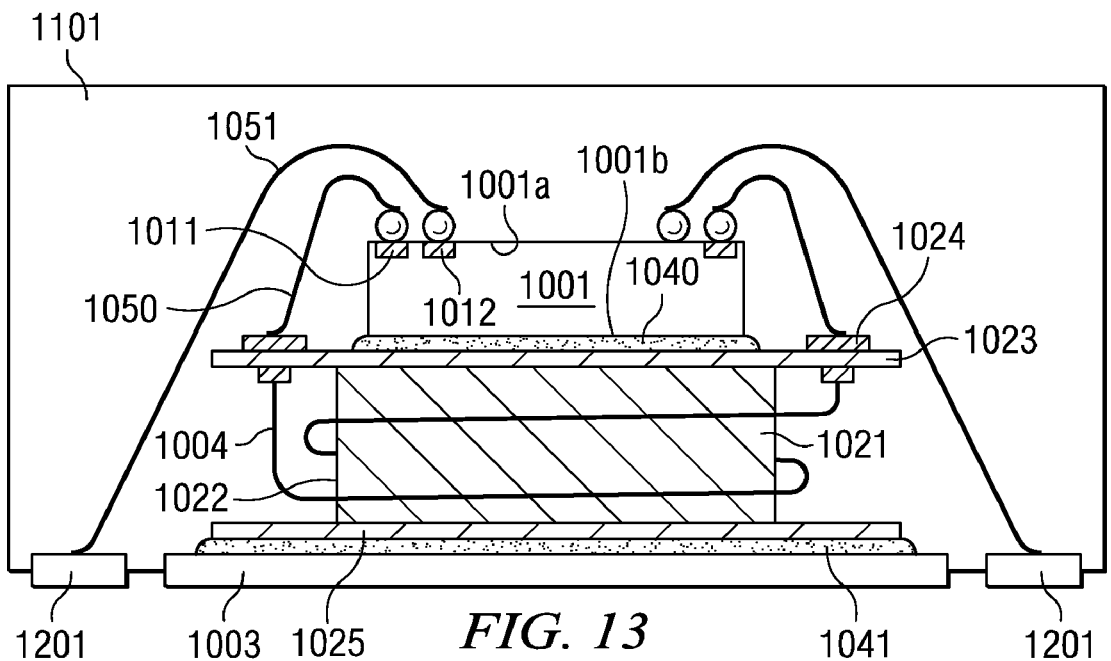

FIG. 13 illustrates the leadless package configuration of the integrated inductor for a power semiconductor device so that the wire ends of inductor wire 1004 are attached to inductor plate 1023, as in FIGS. 10 and 11. The pins 1201 serve the electrical connections 1051 to the component (second set terminals). The resulting device may thus have small size, and the inductor under the component can double as heat spreader. In a variation of the embodiment of FIG. 13, leads 1201 may belong to a substrate different from pad 1003, resulting in higher package integration.

Figure 14:
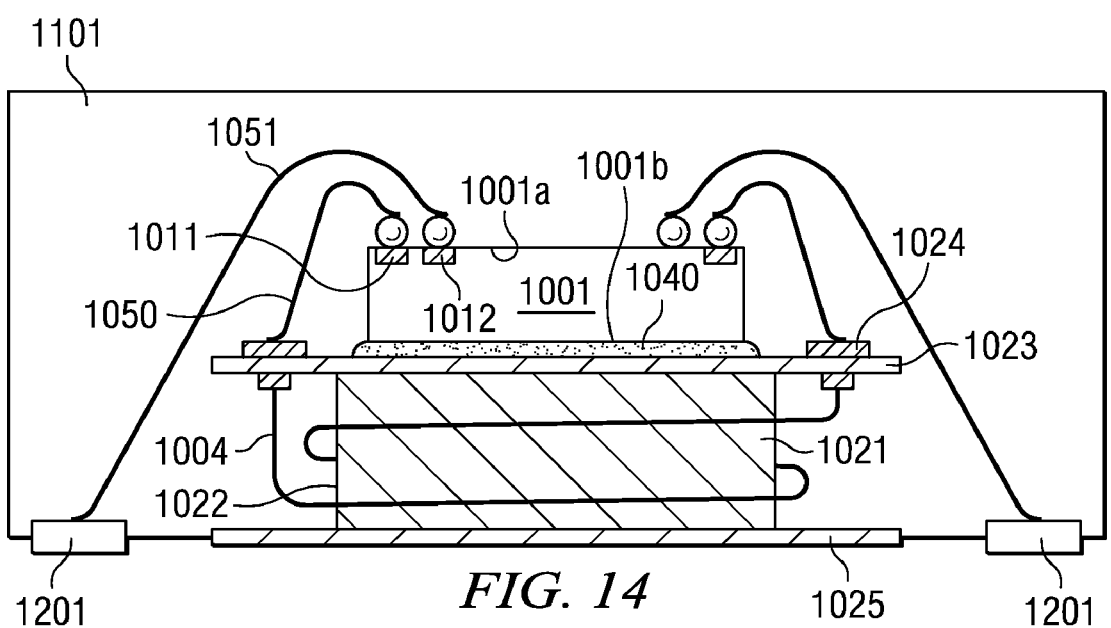

Further improvement of the thermal device performance can be achieved by the leadless package configuration of the embodiment in FIG. 14. The bottom flat portion 1025 of the inductor is directly exposed to the ambient and thus offers a direct thermal path to the ambient or heat sink. In order to facilitate the attachment to a heat sink, it is preferred to plate the outside surface of portion 1025 with a solderable metal configuration, such a layer of nickel followed by an outside layer of palladium.

Another embodiment of the invention is a method for fabricating an electronic device, especially a power device, which integrates an inductor into the package by placing the inductor on top of the power device. The method provides one or more semiconductor chips or components, such as a power driver circuit, a DC-to-DC converter, or a power controller circuit, with an area, an active surface including a first and a second set of terminals, and a passive surface. Further, a substrate, for instance a leadframe or a laminated substrate, is provided with contact pads. The passive surfaces of the components are then attached to the substrate, for instance using a thermally conductive adhesive.

Next, a body containing ferromagnetic material is provided, which includes a flat area smaller than the chip area; an example is a full or hollow iron cylinder. The flat body area is then attached to the active chip surface.

Next, a wire, preferably gold or copper, is provided; the wire has a first and a second end. The wire is wrapped around the body periphery to form at least a portion of a loop, preferably one or more full loops. The first and second wire ends are attached to the first set terminals, for instance by wire bonding. The inductor can produce and control an inductance of several hundred nH.

Finally, the second set terminals are connected to the contact pads. This can be achieved by wire bonding, or by flip-assembly. The assembled inductor, component and substrate may be encapsulated, for example in a molding compound, preferably so that the inductor and the substrate remain available to double as heat spreaders. The result is an integrated, low cost, thermally improved, and geometrically small-area power device with a controlled inductance.

Another embodiment of the invention is a method for fabricating an electronic device, especially a power device, which integrates an inductor into the package by placing the inductor under the power device. The method provides one or more semiconductor chips or components with an active surface including a first and a second set of terminals, and a passive surface. Further a substrate with contact pads is provided.

Next, a body containing ferromagnetic material, such as a full or a hollow iron cylinder, is provided; the body includes a first and a second flat portion, for instance a plate placed on each end of the cylinder. The first flat portion has connection ports. The components are attached, with their passive surfaces, to the first flat portion of the body, for instance by a thermally conductive adhesive.

A wire with a first and a second end is provided. The wire is wrapped around the body to form at least a portion of a loop, and the first and second wire ends are connected to the first set terminals.

The second flat portion of the body is attached to the substrate, for instance by a thermally conductive epoxy or polyimide compound. The first set terminals are connected to the ports; and the second set terminals are connected to the contact pads.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. An electronic device comprising:
   a semiconductor chip having an area;
   ferromagnetic material with a body including a flat area;
   the chip attached to the flat body area;
   a bonder wire having a first and a second end, the bonder wire wrapped around the body to form at least a portion of a loop;
   the first and second bonder wire ends connected to the chip; and
   the chip, the body and the bonder wire encapsulated in an insulating compound.

2. The device according to claim 1 wherein the chip includes one or more circuit chips or discrete components.

3. An electronic device comprising:
- a semiconductor chip having an area, an active surface including a first and a second set of terminals, and a passive surface;
- a substrate having contact pads;
- the passive chip surface attached to the substrate;
- a body containing ferromagnetic material including a flat area smaller than the chip area;
- the flat body area attached to the active chip surface;
- a bonder wire having a first and a second end, the bonder wire wrapped around the body to form at least a portion of a loop;
- the first and second bonder wire ends connected to the first set terminals;
- the second set terminals connected to the contact pads; and
- insulating compound encapsulating the assembled chip, ferromagnetic body and electrical connections.

4. The device according to claim 3 further including a thermally conductive attach material between the body and the chip.

5. The device according to claim 3 further having an insulation between the looping bonder wire and the body.

6. The device according to claim 5 wherein the insulation is provided by separators creating a distance between the looping bonder wire and the surface of the body.

7. The device according to claim 3 wherein the connections of the bonder wire ends to the first set terminals are wire bonds.

8. The device according to claim 3 wherein the connections of the second set terminals to the contact pads are wire bonds.

9. The device according to claim 3 wherein the connections of the second set terminals to the contact pads are metal studs.

10. The device according to claim 3 wherein the substrate is a metallic leadframe.

11. The device according to claim 3 wherein the flat area of the ferromagnetic body is formed by a plate extending beyond the body periphery, the extension providing connection sites for the first and second bonder wire ends as well as conductive attachment of the body to the first set chip terminals.

12. The device according to claim 11 wherein the plate is made of ferromagnetic material so that the plate is operable to shield the magnetic field from interfering with the chip.

13. An electronic device comprising:
- a semiconductor chip having an active surface including a first and a second set of terminals, and a passive surface;
- a substrate having contact pads;
- a body containing ferromagnetic material including a first and a second flat portion, a flat portion having connection ports;
- the passive chip surface attached to the first flat portion of the body;
- the first set terminals connected to the ports;
- a bonder wire having a first and a second end, the bonder wire wrapped around the body to form at least a portion of a loop;
- the first and second bonder wire ends connected to the first set terminals;
- the second flat portion of the body attached to the substrate; and
- the second set terminals connected to the contact pads.

14. The device according to claim 13 further having passive units assembled with the chip or the body.

15. The device according to claim 13 further including an encapsulation of the assembled chip, ferromagnetic body and electrical connections in an insulating compound.

16. The device according to claim 13 wherein the substrate is a metallic leadframe.

17. The device according to claim 13 wherein the first and the second flat portion of the body containing ferromagnetic material is formed by a plate extending beyond the body periphery, the extension providing connection sites for the first and second bonder wire ends as well as conductive attachment of the body to the first set chip terminals.

18. The device according to claim 17 wherein the plates are made of ferromagnetic material so that the plates are operable to shield the magnetic field from interfering with the chip.

* * * * *